(12) United States Patent
Wang et al.

(10) Patent No.: US 11,056,386 B2
(45) Date of Patent: Jul. 6, 2021

(54) TWO-DIMENSIONAL (2D) SELF-ALIGNED CONTACT (OR VIA) TO ENABLE FURTHER DEVICE SCALING

(71) Applicant: International Business Machines Corporation, Armonk, NY (US)

(72) Inventors: Junli Wang, Slingerlands, NY (US); Veeraraghavan S. Basker, Schenectady, NY (US); Chun-Chen Yeh, Danbury, CT (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/456,540

(22) Filed: Jun. 28, 2019

(65) Prior Publication Data

US 2020/0411376 A1 Dec. 31, 2020

(51) Int. Cl.

| | |
|---|---|
| *H01L 21/768* | (2006.01) |
| *H01L 23/522* | (2006.01) |
| *H01L 21/8238* | (2006.01) |
| *H01L 29/06* | (2006.01) |
| *H01L 29/417* | (2006.01) |
| *H01L 23/532* | (2006.01) |
| *H01L 23/528* | (2006.01) |

(52) U.S. Cl.
CPC ......... *H01L 21/76897* (2013.01); *H01L 21/823807* (2013.01); *H01L 21/823871* (2013.01); *H01L 23/528* (2013.01); *H01L 23/5226* (2013.01); *H01L 23/53209* (2013.01); *H01L 29/0649* (2013.01); *H01L 29/41775* (2013.01)

(58) Field of Classification Search
CPC ....... H01L 21/76897; H01L 21/823871; H01L 23/53209; H01L 29/41775; H01L 23/528; H01L 23/5226; H01L 29/0649; H01L 21/823807
USPC ........................................................ 257/774
See application file for complete search history.

(56) References Cited

U.S. PATENT DOCUMENTS

| | | |
|---|---|---|
| 5,430,328 A | 7/1995 | Hsue |
| 6,337,285 B1 | 1/2002 | Ko |
| 9,202,751 B2 | 12/2015 | Wei et al. |
| 9,368,446 B2 | 6/2016 | Chen et al. |
| 9,818,651 B2 | 11/2017 | Bouche et al. |
| 9,887,133 B2 | 2/2018 | Chi et al. |
| 2002/0179966 A1 | 12/2002 | Yang et al. |

(Continued)

OTHER PUBLICATIONS

Carmona, M., et al., "Study of gate contact over active area", 29th Symposium on Microelectronics Technology and Devices (SBMicro), Date of Conference: Sep. 1-5, 2014, 4 pp., Conference Location: Aracaju, Brazil.

*Primary Examiner* — Caleen O Sullivan
(74) *Attorney, Agent, or Firm* — Scully, Scott, Murphy & Presser, P.C.; Erik Johnson

(57) ABSTRACT

2D self-aligned contact structures (both gate contact and source/drain contact) are provided that can improve the process control and push further scaling. The 2D self-aligned contact structures can enable tighter process control which can lead to further device scaling. In accordance with the present application, the gate contact structure is confined in one direction by a sacrificial spacer structure that is present in a dielectric material layer, and in another direction by an edge of a metallization structure that is located above the gate contact structure.

12 Claims, 13 Drawing Sheets

(56) References Cited

U.S. PATENT DOCUMENTS

| | | |
|---|---|---|
| 2006/0240654 A1 | 10/2006 | Wei et al. |
| 2015/0021683 A1* | 1/2015 | Xie ................. H01L 21/823425 257/330 |
| 2015/0187636 A1* | 7/2015 | Ho .................... H01L 21/76251 257/774 |
| 2017/0263557 A1 | 9/2017 | Clevenger et al. |
| 2017/0263715 A1 | 9/2017 | Bouche et al. |
| 2018/0286956 A1 | 10/2018 | Xie et al. |

* cited by examiner

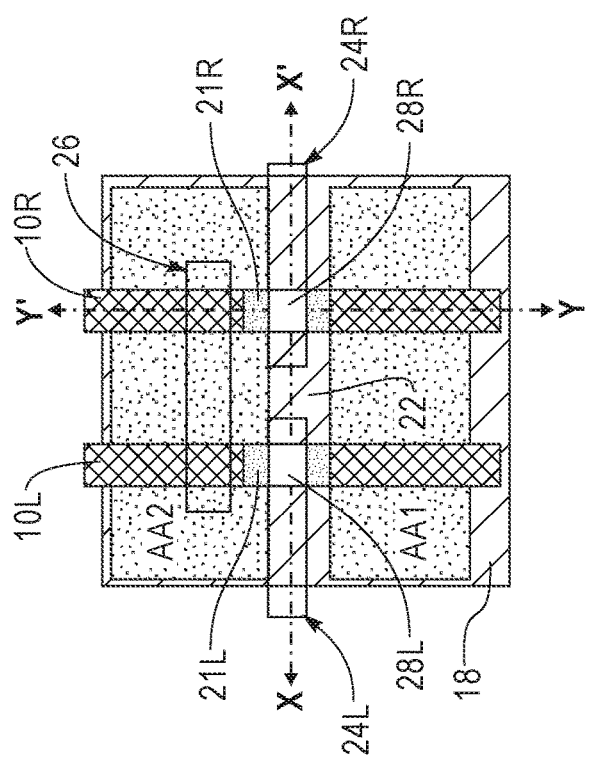
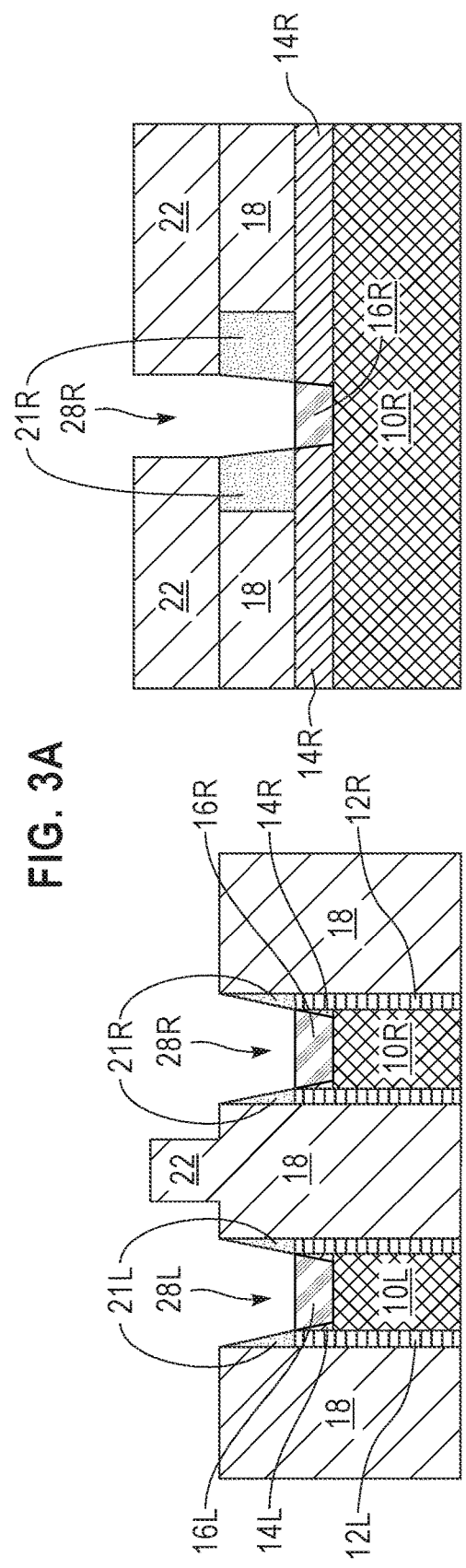
FIG. 3A
FIG. 3B
FIG. 3C

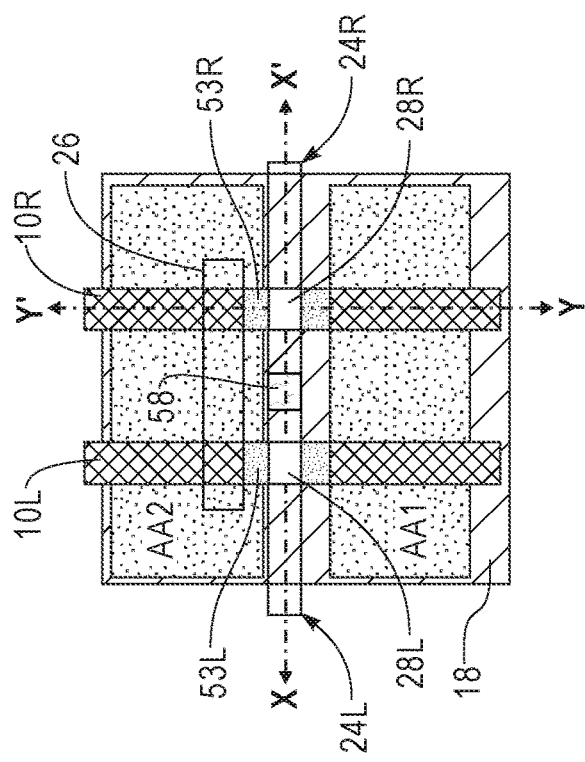
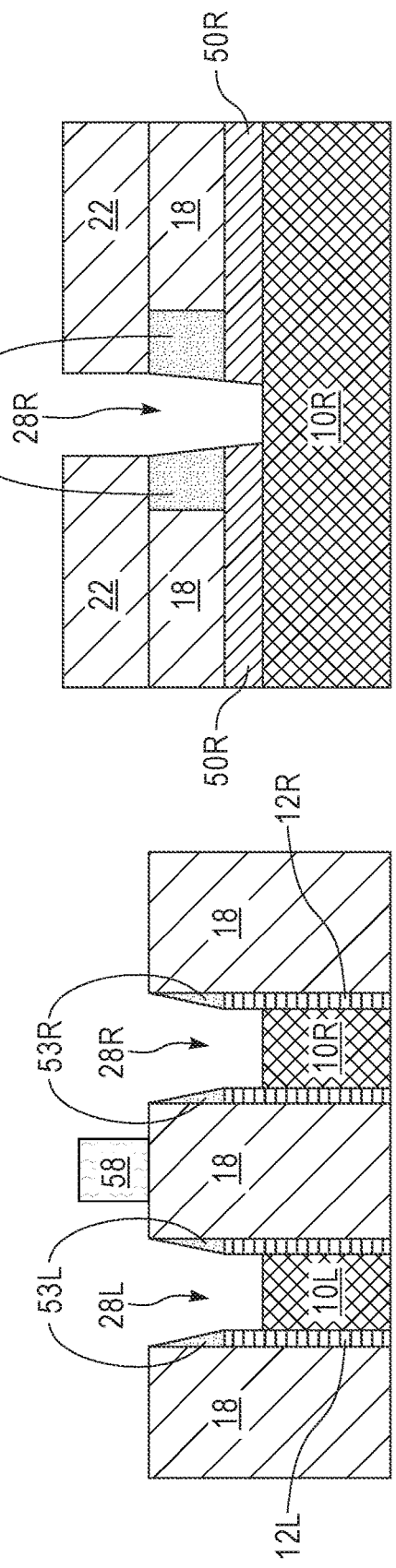
FIG. 11A
FIG. 11B
FIG. 11C

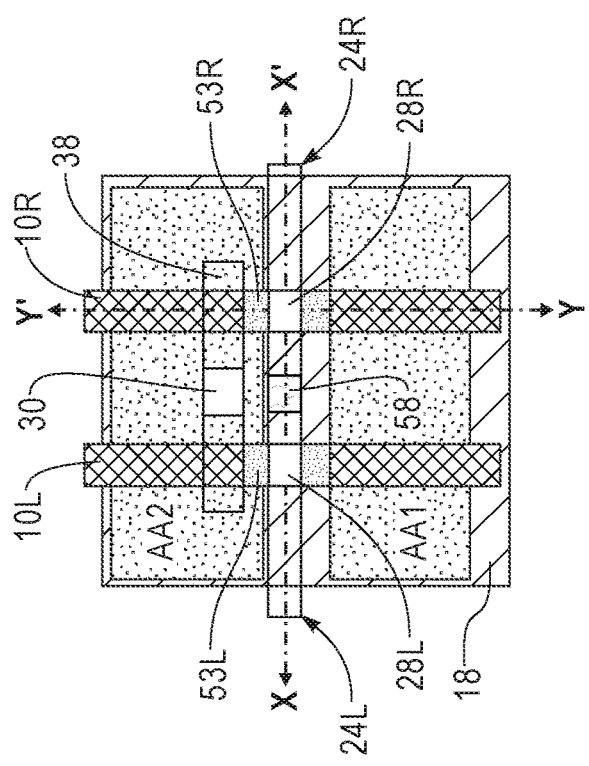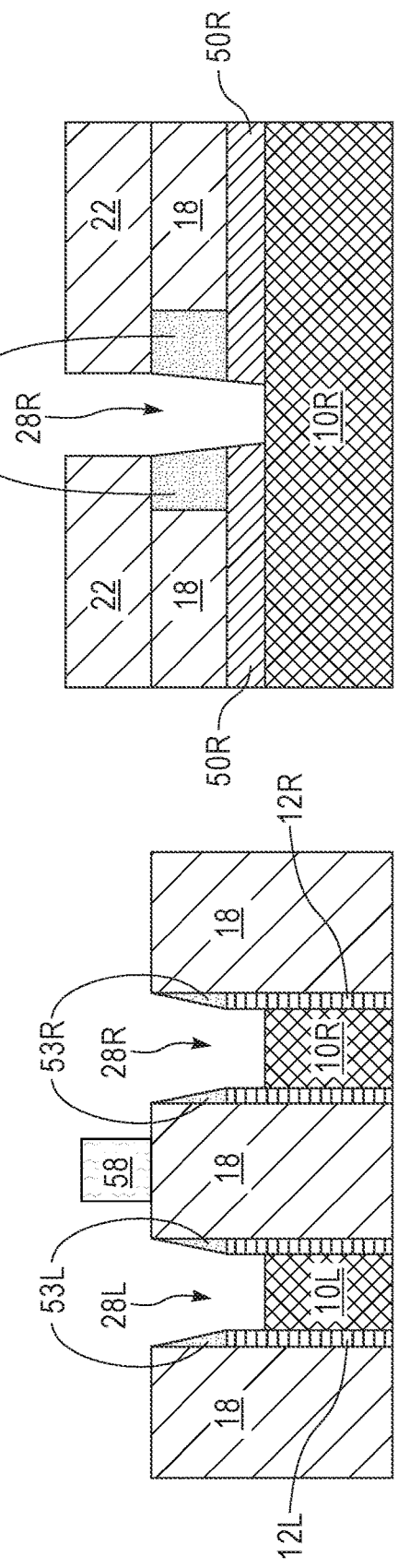

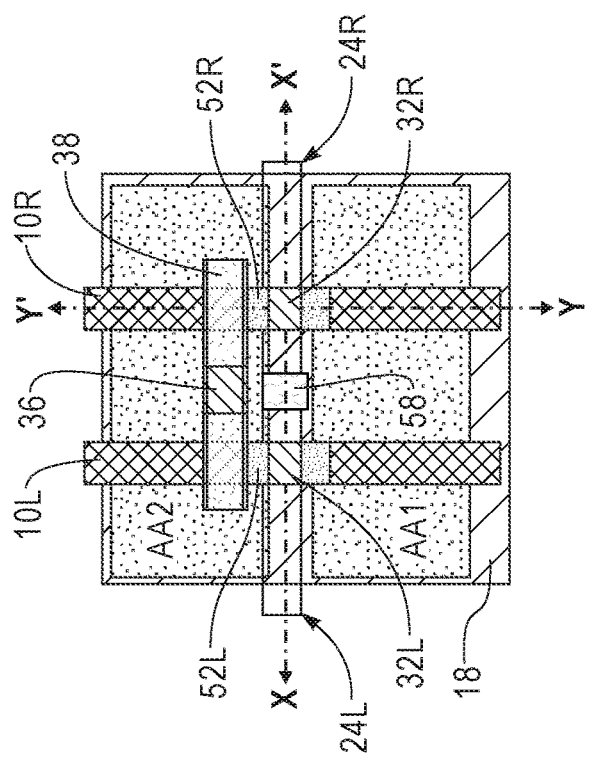
FIG. 13A
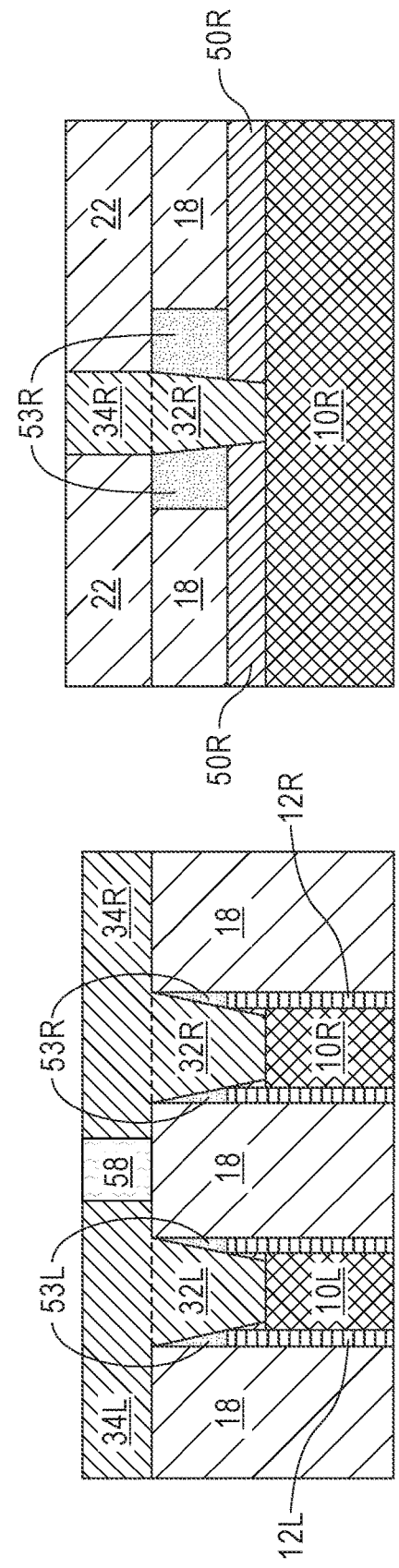
FIG. 13B
FIG. 13C

TWO-DIMENSIONAL (2D) SELF-ALIGNED CONTACT (OR VIA) TO ENABLE FURTHER DEVICE SCALING

BACKGROUND

The present application relates to a semiconductor structure and a method of forming the same. More particularly, the present application relates to a semiconductor structure containing 2D self-aligned contact structures which enable tighter process control and further device scaling.

With the progression in CMOS technology, the gate contact has been moved from over the shallow trench isolation (STI) region to over the active area (AA). This movement of the gate contact from over the STI region to over the AA can reduce the area of the CMOS devices in order to increase the devices density of integration and to decrease the cost of a given technology.

In CMOS devices in which the gate contact is present over the AA, the gate contact and the source/drain contact will have horizontal (in both the x-direction and the y-direction) ground rule/design rule challenges. The x- and y-directions are defined by lithography.

Gate contacts and/or source/drain contacts that are formed though a trench can only provide one-dimensional (1D) self-alignment. Notably, the 1D is confined by the trench edge. The other dimension is still defined by lithography; hence no self-aligned contact feature is obtained.

SUMMARY 2D self-aligned contact structures (both gate contact and source/drain contact) are provided that can improve the process control and push further scaling. The 2D self-aligned contact structures can enable tighter process control which can lead to further device scaling.

In one aspect of the present application, a semiconductor structure containing 2D self-aligned contact structures is provided. In one embodiment, the semiconductor structure includes a gate structure present on a semiconductor material and comprising at least a gate electrode, wherein a source/drain region is present in the semiconductor material. A dielectric material layer is located laterally adjacent to the gate structure and on a surface of the semiconductor material. A gate contact structure is located above the gate electrode, and a metallization structure is located on the gate contact structure. In accordance with the present application, the gate contact structure is confined in one direction by a sacrificial spacer structure that is present in the dielectric material layer, and in another direction by an edge of the metallization structure.

In another aspect of the present application, a method of forming a semiconductor structure containing 2D self-aligned contact structures is provided. In one embodiment, the method includes forming a gate structure on a semiconductor material and comprising at least a gate electrode and a metal-containing structure, wherein a source/drain region is formed in the semiconductor material. Next, a first dielectric material layer is formed laterally adjacent to, and above, the gate structure. A sacrificial structure is then formed in the first dielectric material layer and above the metal-containing structure. A second dielectric material layer containing a metallization trench is formed on the first dielectric material layer, wherein the metallization trench physically exposes the metal-containing structure. Next, a portion of sacrificial structure is removed to provide a gate contact via in the metallization trench, wherein a remaining portion of the sacrificial structure defines sidewalls of the gate contact via. A contact metal or contact metal alloy is then formed in the gate contact via and the metallization trench, wherein the contact metal or metal alloy in the gate contact via provides a gate contact structure and the contact metal or metal alloy in the metallization trench provides a metallization structure, wherein the gate contact structure is confined in one direction by the remaining sacrificial structure, and in another direction by an edge of the metallization trench.

In another embodiment, the method includes forming a gate structure on a semiconductor material and comprising at least a gate electrode and a gate cap dielectric material, wherein a source/drain region is formed in the semiconductor material. Next, a first dielectric material layer is formed laterally adjacent to, and above, the gate structure. A sacrificial structure is then formed in the first dielectric material layer and above the gate cap dielectric material. A second dielectric material layer containing a sacrificial trench structure is formed on the first dielectric material layer. The sacrificial trench structure is cut to provide a gap in the sacrificial trench structure, and thereafter the gap is filled with a gap filling material. Next, the sacrificial trench structure is removed to provide a metallization trench defined by the gap filling material, wherein the metallization trench physically exposes the sacrificial structure. A portion of sacrificial structure and the gate gap dielectric material are then removed to provide a gate contact via in the metallization trench, wherein a remaining portion of the sacrificial structure defines sidewalls of the gate contact via. A contact metal or contact metal alloy is then formed in the gate contact via and the metallization trench, wherein the contact metal or metal alloy in the gate contact via provides a gate contact structure and the contact metal or metal alloy in the metallization trench provides a metallization structure, wherein the gate contact structure is confined in one direction by the remaining sacrificial structure, and in another direction by an edge of the metallization trench.

BRIEF DESCRIPTION OF THE DRAWINGS

FIG. 3A is a top down view of the exemplary semiconductor structure of FIG. 2A after removing the first sacrificial structure from the first metallization trench to define a first gate contact via and removing the second sacrificial structure from the second metallization trench to define a second gate contact via.

FIG. 3B is a cross view of the exemplary semiconductor structure of FIG. 3A through line X-X'.

FIG. 3C is a cross view of the exemplary semiconductor structure of FIG. 3A through line Y-Y'.

FIG. 11A is a top down view of the exemplary structure of FIG. 10A after removing the first sacrificial structure and the first gate cap dielectric material from the first metallization trench to define a first gate contact via, and removing the second sacrificial structure and the second gate cap dielectric material from the second metallization trench to define a second gate contact via.

FIG. 11B is a cross view of the exemplary semiconductor structure of FIG. 11A through line X-X'.

FIG. 11C is a cross view of the exemplary semiconductor structure of FIG. 11A through line Y-Y'.

FIG. 12A is a top down view of the exemplary semiconductor structure of FIG. 11A after forming a source/drain contact via in a portion of the third metallization trench.

FIG. 12B is a cross view of the exemplary semiconductor structure of FIG. 12A through line X-X'.

FIG. 12C is a cross view of the exemplary semiconductor structure of FIG. 12A through line Y-Y'.

FIG. 13A is a top down view of the exemplary semiconductor structure of FIG. 12A after filling each of the first gate contact via, the first metallization trench, the second gate contact via, the second metallization trench, the source/drain contact via, and the third metallization trench with a contact metal or contact metal alloy.

FIG. 13B is a cross view of the exemplary semiconductor structure of FIG. 13A through line X-X'.

FIG. 13C is a cross view of the exemplary semiconductor structure of FIG. 13A through line Y-Y'.

DETAILED DESCRIPTION

Figure 1A:
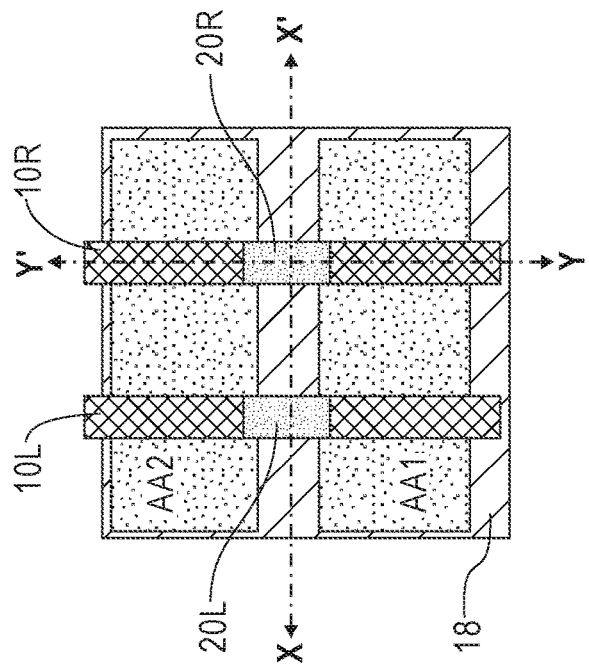
FIG. 1A is a top down view of an exemplary semiconductor structure that can be employed in accordance with an embodiment of the present application, the exemplary structure includes a first gate structure comprising a first gate conductor and a first metal structure, a second gate structure comprising a second gate conductor and a second metal structure, and a first dielectric material layer laterally surrounding the first and second gate structures, wherein a first sacrificial structure is embedded in the first dielectric material layer and contacting the first metal structure, and a second sacrificial structure is embedded in the first dielectric material layer and contacting the second metal structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1C:
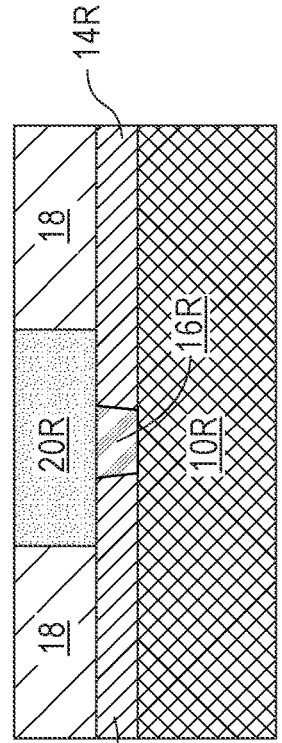
FIG. 1C is a cross view of the exemplary semiconductor structure of FIG. 1A through line Y-Y'.
Figure 1B:
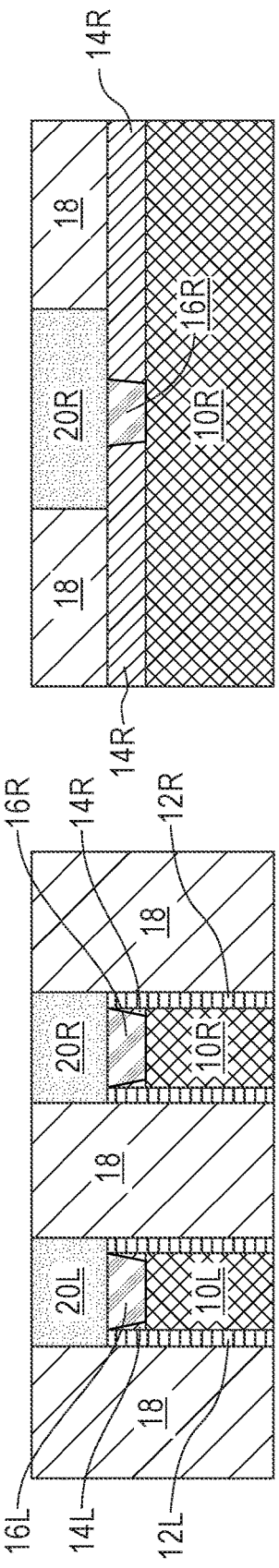
FIG. 1B is a cross view of the exemplary semiconductor structure of FIG. 1A through line X-X'.

Referring first to FIGS. 1A, 1B and 1C, there are shown various views of an exemplary semiconductor structure that can be employed in accordance with an embodiment of the present application. In this embodiment, the exemplary structure includes a first gate structure comprising a first gate conductor 10L and a first metal-containing structure 16L, a second gate structure comprising a second gate conductor 10R and a second metal-containing structure 16R, and a first dielectric material layer 18 laterally surrounding the first and second gate structures, wherein a first sacrificial structure 20L is embedded in the first dielectric material layer 18 and contacting the first metal-containing structure 16L, and a second sacrificial structure 20R is embedded in the first dielectric material layer 18 and contacting the second metal-containing structure 16R.

The first gate structure may also include a first dielectric spacer 12L located laterally adjacent to the first gate conductor 10L and the first metal-containing structure 16L, and the first metal-containing structure 16L may be embedded within a first gate cap dielectric material 14L. The second gate structure may also include a second dielectric spacer 12R located laterally adjacent to the second gate conductor 10R and the second metal-containing structure 16R, and the second metal-containing structure 16R may be embedded within a second gate cap dielectric material 14R.

The exemplary structure shown in FIGS. 1A, 1B and 1C can be formed utilizing techniques well known to those skilled in the art. So as not to obscure the method of the present application, details regarding the method used in providing the exemplary structure shown in FIGS. 1A, 1B and 1C have been omitted.

Although not shown in the drawings, the first gate structure would include a first gate dielectric material located beneath and optionally along sidewalls, of the first gate electrode 10L, and the second gate structure would include a second gate dielectric material located beneath and optionally along sidewalls, of the second gate electrode 10R.

In the top down view shown in FIG. 1A, element AA1 represent a first active area and element AA2 represents a second active area; the active areas in the top view are shown for clarity (in reality the first dielectric material layer 18 is located on the active areas. The first and second active areas AA1 and AA2 are regions of the structure including a semiconductor material. Illustrative examples of semiconductor material that provide the first and second active areas AA1 and AA2 include, for example, silicon (Si), a silicon germanium (SiGe) alloy, a silicon germanium carbide (SiGeC) alloy, germanium (Ge), III/V compound semiconductors or II/VI compound semiconductors.

In some embodiments, the semiconductor material that provides the first and second active areas AA1 and AA2 is present on a base semiconductor material. The base semiconductor material may be composed of a semiconductor material that is compositionally the same as, or compositionally different from, the semiconductor material that provides the first and second active areas AA1 and AA2. In some embodiments, the semiconductor material that provides the first and second active areas AA1 and AA2 is present on an insulator layer such as, for example, a silicon dioxide layer.

In one embodiment, the semiconductor material that provides the first and second active area is a semiconductor fin that is formed utilizing techniques well known to those skilled in the art. In some examples, a sidewall image transfer (SIT) process, lithography and etching, or a direct self-assembly (DSA) process can be used to provide semiconductor fins. As used herein, a "semiconductor fin" refers to a structure composed of a semiconductor material, as defined above, that includes a pair of vertical sidewalls that are parallel to each other. A surface is "vertical" if there exists a vertical plane from which the surface does not deviate by more than three times the root mean square roughness of the surface. In one embodiment, the semiconductor fin 14 has a height from 20 nm to 200 nm, a width from 4 nm to 30 nm, and a length from 20 nm to 200 nm. Other heights and/or widths and/or lengths that are lesser than, or greater than, the ranges mentioned herein can also be used in the present application. When a plurality of semiconductor fins are present, each semiconductor fin is spaced apart from its nearest neighboring semiconductor fin by a pitch of from 20 nm to 100 nm; the pitch is measured from one point of one semiconductor fin to the exact point on a neighboring semiconductor fin.

The first and second gate structures may be formed utilizing techniques well known to those skilled in the art. In one example, a gate first process is used to provide the first and second gate structures. In a gate first process, a gate material stack including a gate dielectric material and a gate electrode material are first formed, then patterned and thereafter source/drain regions are formed into a portion of the semiconductor material. In another embodiment, a gate last process can be used. In a gate last process, sacrificial gate structures are first formed, and then source/drain regions are formed into a portion of the semiconductor material. The sacrificial gate structure is then replaced with a functional gate structure. By "functional gate structure" it is meant a permanent gate structure used to control output current (i.e., flow of carriers in the channel) of a semiconducting device through electrical or magnetic fields. In the present application, the first and second gate structures are functional gate structures.

In some embodiments and when the first and second gate structures are formed on a semiconductor fin, the first and second gate structure straddle over a portion each of the semiconductor fins. The term "straddle over" denotes that a first material contains a first region present on a first side of a second material, and a second region that is present on a second side of the second material, wherein the two regions of the first material are interconnected by a third region of the first material that extends above a topmost surface of the second material.

As mentioned above the first gate structure includes a first gate dielectric material (not shown) and the first gate conductor 10L, and the second gate structure includes a second gate dielectric material (not shown) and the second gate conductor 10R.

The first and second gate dielectric materials can be composed of a dielectric oxide, dielectric nitride, and/or dielectric oxynitride. In one example, the first and second gate dielectric materials can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure composed of different gate dielectric materials, e.g., silicon dioxide, and a high-k gate dielectric, can be formed and used as the first and second gate dielectric materials. The first gate dielectric material may be compositionally the same as, or compositionally different from the second gate dielectric material.

The first and second gate dielectric materials can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the first and second gate dielectric materials can have a thickness in a range from 1 nm to 10 nm. Other thicknesses that are lesser than, or greater than, the aforementioned thickness range can also be employed for the gate dielectric material that may provide the first and second gate dielectric materials.

The first gate conductor 10L and the second gate conductor 10R can include a same or different gate conductor material. The gate conductor material used in providing the first and second gate conductors 10L and 10R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the first gate conductor 10L can comprise an nFET gate metal, while the second gate conductor 10R can comprise a pFET gate metal. In another embodiment, the first gate conductor 10L can comprise a pFET gate metal, while the second gate conductor 10R can comprise an nFET gate metal.

The gate conductor material used in providing the first and second gate conductors 10L and 10R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the first and second gate conductors 10L and 10R can have a thickness from 50 nm to 200 nm. Other thicknesses that are lesser than, or greater than, the aforementioned thickness range can also be employed for the gate conductor material used in providing the first and second gate conductors 10L and 10R.

The first gate structure also includes a first gate cap dielectric material 14L located on the first gate electrode 10L and a first metal-containing structure 16L embedded within the first gate cap dielectric material 14L, and the second gate structure also includes a second gate cap dielectric material 14R located on the second gate electrode 10R and a second metal-containing structure 16R embedded in the second gate cap dielectric material 14R.

The first gate cap dielectric material 14L and the second gate cap dielectric material 14R may be composed of any gate cap dielectric material. Illustrative examples of gate cap dielectric materials that can be used in providing the first and second gate cap dielectric materials 14L and 14R include silicon dioxide and/or silicon nitride. The first gate cap dielectric material 14L may be composed of a compositionally same gate gap dielectric material as, or a compositionally different gate cap dielectric material than, the second gate cap dielectric material 14R. The gate cap dielectric material that provides the first and second gate cap dielectric materials 14L and 14R can be formed by any suitable deposition process such as, for example, chemical vapor deposition or plasma enhanced chemical vapor deposition. In one embodiment, the gate cap dielectric material that provides the first and second gate cap dielectric materials 14L and 14R can have a thickness from 10 nm to 100 nm. Other thicknesses that are lesser than, or greater than, the aforementioned thickness range can also be employed for the gate cap dielectric material used in providing the first and second gate cap dielectric materials 14L and 14R.

The first metal-containing structure 16L and the second metal-containing structure 16R can include any electrically conductive metal or metal alloy. Illustrative examples of electrically conductive metals or metal alloys that can be used in providing the metal-containing structures 16L and 16R include W, Co, Ru, Ti, TiN, Ta or TAN. The first metal-containing structure 16L may be composed of a compositionally same electrically conductive metal or metal alloy as, or a compositionally different electrically conductive metal or metal alloy than, the second metal-containing structure 16R. The electrically conductive metal or metal alloy that provides the first and second metal-containing structures 16L and 16R can be formed by any suitable deposition process such as, for example, chemical vapor deposition, plasma enhanced chemical vapor deposition, sputtering or plating. In one embodiment, the electrically conductive metal or metal alloy that provides the first and second metal-containing structures 16L and 16R can have a thickness from 10 nm to 100 nm. Other thicknesses that are lesser than, or greater than, the aforementioned thickness range can also be employed for the electrically conductive metal or metal alloy used in providing the first and second metal-containing structures 16L and 16R. As is shown, the first metal-containing structure 16L has a topmost surface that is typically coplanar with a topmost surface of the first gate cap dielectric material 14L, and the second metal-containing structure 16R has a topmost surface that is typically coplanar with a topmost surface of the second gate cap dielectric material 14R.

The exemplary structure as shown in FIGS. 1A, 1B and 1C also includes a first dielectric spacer 12L and a second dielectric spacer 12R. The first and second dielectric spacers 12L and 12R can be composed of any dielectric spacer material including for example silicon dioxide, silicon nitride and/or silicon oxynitride. The first dielectric spacer 12L may be composed of a compositionally same dielectric spacer material as, or a compositionally different dielectric spacer material than, the second dielectric spacer 12R. The dielectric spacer material that provides the first and second dielectric spacers 12L and 12R can be formed by any suitable deposition process such as, for example, chemical vapor deposition or plasma enhanced chemical vapor deposition, followed by a spacer etch. The first dielectric spacer 12L typically has a topmost surface that is coplanar with a topmost surface of each of the first gate cap dielectric material 14L and the first metal-containing structure 16L, while the second dielectric spacer 12R typically has a topmost surface that is coplanar with a topmost surface of each of the second gate cap dielectric material 14R and the second metal-containing structure 16R.

The first dielectric material layer 18 is composed of any dielectric material including for example, silicon dioxide and/or silicon nitride. The first dielectric material layer 18 can be formed by any suitable deposition process such as, for example, chemical vapor deposition or plasma enhanced chemical vapor deposition. The first dielectric material layer 18 is formed above the first and second metal-containing structures 16L and 16R. The first dielectric material layer 18 can be formed by any suitable deposition process such as, for example, chemical vapor deposition or plasma enhanced chemical vapor deposition.

A first opening (not shown) and a second opening (not shown) are formed into the first dielectric material layer 18 utilizing lithography and etching. The first opening is located above the first metal-containing structure 16L of the first gate structure, and the second opening is located above the second metal-containing structure 16R of the second gate structure. A first sacrificial structure 20L is formed in the first opening, and a second sacrificial structure 20R is formed in the second opening. The first and second sacrificial structures 20L and 20R are formed by first depositing a sacrificial dielectric material in each of the first and second openings and atop the first dielectric material layer 18, and then a planarization process such as, for example, chemical mechanical polishing can be used to remove the sacrificial dielectric material that is present outside the first and second openings and atop the first dielectric material layer.

The first and second sacrificial structures 20L and 20R are composed of a compositionally same sacrificial dielectric material. The sacrificial dielectric material that provides the first and second sacrificial structures 20L and 20R is compositionally different from the dielectric material that provides the first dielectric material layer 18 (and the second dielectric material layer to be subsequently formed), the first and second spacers 12L and 12R and the first and second gate cap dielectric material 14L and 14R. In one example, the sacrificial dielectric material that provides the first and second sacrificial structures 20L and 20R is composed of a dielectric material having a dielectric constant that is lower than silicon dioxide. Examples of dielectric materials having a dielectric constant that is lower silicon dioxide and thus can be used as the sacrificial dielectric material that provides the first and second sacrificial structures 20L and 20R include, but are not limited to, SiOC, SiC or SiBCN. As is shown, each of the first and second sacrificial structures 20L and 20R has a topmost surface that is coplanar with each other, and coplanar with the topmost surface of the first dielectric material layer 18.

Figure 2A:
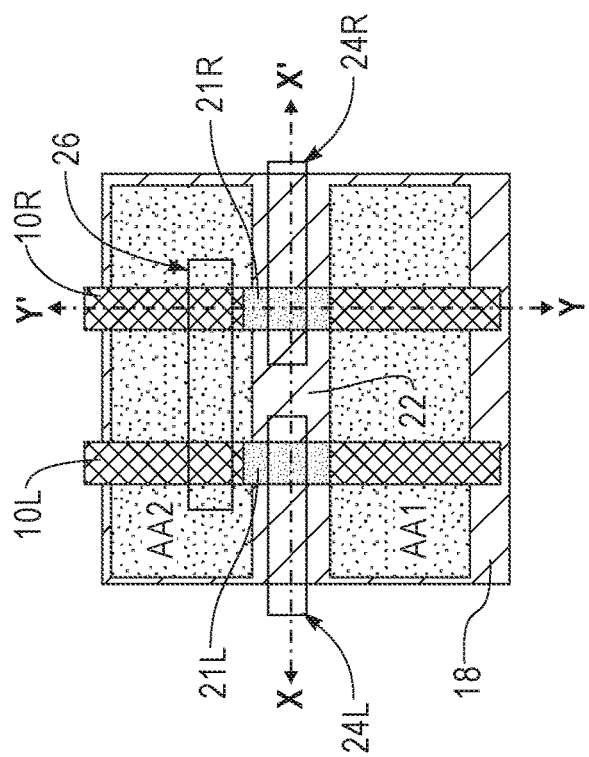
FIG. 2A is a top down-view of the exemplary structure of FIG. 1A after depositing a second dielectric material layer on the first dielectric material layer and forming a first metallization trench, a second metallization trench and a third metallization trench into the second dielectric material layer, wherein the first metallization trench is located over the first gate structure, the second metallization trench is located over the second gate structure, and the third metallization trench is located over a source/drain region.
Figure 2C:
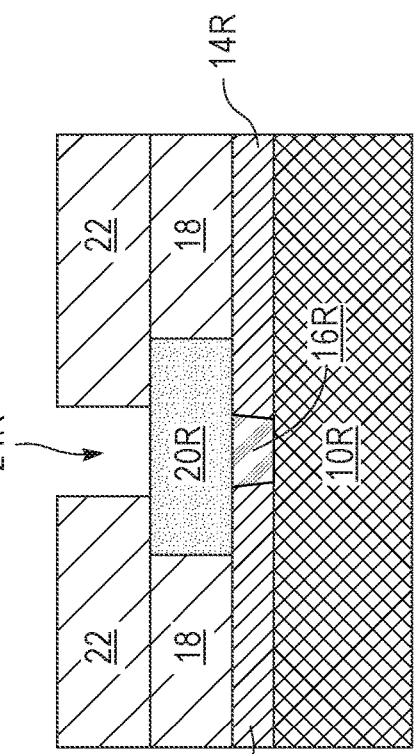
FIG. 2C is a cross view of the exemplary semiconductor structure of FIG. 2A through line Y-Y'.
Figure 2B:
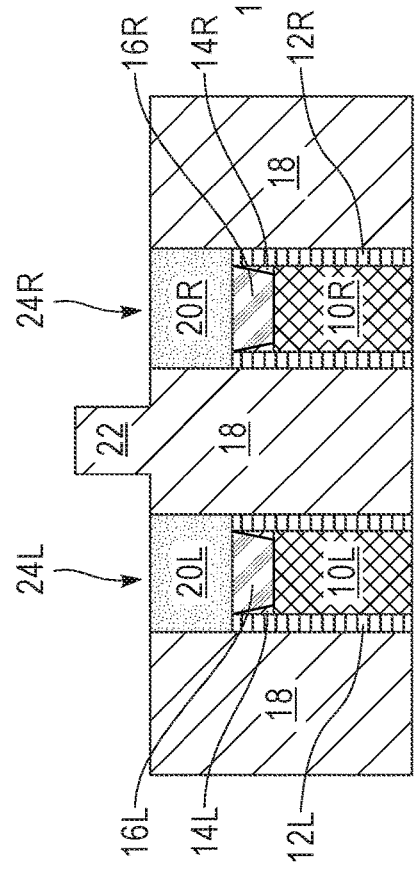
FIG. 2B is a cross view of the exemplary semiconductor structure of FIG. 2A through line X-X'.

Referring now to FIGS. 2A, 2B and 2C, there are shown various views of the exemplary structure of FIGS. 1A, 1B and 1C after depositing a second dielectric material layer 22 on the first dielectric material layer 18 and forming a first metallization trench 24L, a second metallization trench 24R and a third metallization trench 26 into the second dielectric material layer 22, wherein the first metallization trench 24L is located over the first gate structure, the second metallization trench 24R is located over the second gate structure, and the third metallization trench 26 is located over a source/drain region.

The second dielectric material layer 22 is composed of one of the dielectric materials mentioned above for the first dielectric material layer 18; the second dielectric material layer 22 is compositionally different from the sacrificial dielectric material used in providing the first and second sacrificial structures 20L and 20R. In one embodiment, the second dielectric material layer 22 is composed of a compositionally same dielectric material as the first dielectric material layer 18. In another embodiment, the second dielectric material layer 22 is composed of a compositionally different dielectric material than the first dielectric material layer 18. The second dielectric material layer 22 can be formed by any suitable deposition process such as, for example, chemical vapor deposition or plasma enhanced chemical vapor deposition. The second dielectric material layer 22 can have a thickness from 50 nm to 200 nm; although other thicknesses are possible and can be used as the thickness of the second dielectric material layer 22.

In one embodiment, the first metallization trench 24L, the second metallization trench 24R and the third metallization trench 26 are formed into the second dielectric material layer 22 utilizing lithography and etching. In another embodiment, the first metallization trench 24L, the second metallization trench 24R and the third metallization trench 26 are formed into the second dielectric material layer 22 utilizing a direct self-assembly (DSA) process.

Each of the first metallization trench 24L, the second metallization trench 24R and the third metallization trench 26 may have a width from 10 nm to 100 nm, and a length from 10 nm to 10 μm. Other widths and lengths are possible for each of the first metallization trench 24L, the second metallization trench 24R and the third metallization trench 26.

The first metallization trench 24L, which is located above the first gate structure, physically exposes the first sacrificial structure 20L that is embedded in the first dielectric material layer 18, the second metallization trench 24R, which is located above the second gate structure, physically exposes the second sacrificial structure 20R that is embedded in the first dielectric material layer 18, and the third metallization trench 26, which is located above the source/drain region physically exposes the dielectric material layer 18 that is located between neighboring gate structures, the gate cap dielectric material 14L or 14R that is located on the gate structures, and the spacers 14L or 14R.

Referring now to FIGS. 3A, 3B and 3C, there are shown various views of the exemplary semiconductor structure of FIGS. 2A, 2B and 2C after removing the first sacrificial structure 20L from the first metallization trench 24L to define a first gate contact via 28L and removing the second sacrificial structure 20R from the second metallization trench 24R to define a second gate contact via 28R. The removal of the first and second sacrificial structures 20L and 20R that are physically exposed in the respective metallization trench is performed simultaneously utilizing a same etching process. The etching process is selective in removing the physically exposed portions of the first and second sacrificial structures 20L and 20R.

As is shown, portions of the first sacrificial structure 20L remain and define the sidewalls of the first gate contact via 28L; the remaining portions of the first sacrificial structure 20L may be referred to herein as a first sacrificial spacer structure 21L. As is also shown, portions of the second sacrificial structure 20R remain and define the sidewalls of the second gate contact via 28R; the remaining portions of the second sacrificial structure 20R may be referred to herein as a second sacrificial spacer structure 21R. The first and second sacrificial spacer structures 21L and 21R have innermost sidewalls that may be vertical or have some slight tapering as shown in FIGS. 3B and 3C.

The first gate contact via 28L, which is located above the first gate structure, physically exposes the first metal-containing structure 16L, while the second gate contact via 28R, which is located above the second gate structure, physically exposes the second metal-containing structure 16R.

As is shown, the first sacrificial spacer structure 21L is located on a surface of the first dielectric spacer 12L that is located adjacent to the first gate structure, and the second sacrificial spacer structure 21R is located on a surface of the second dielectric spacer 12R that is located adjacent to the second gate structure. Each of the first sacrificial spacer structure 21L, the first dielectric spacer 12L, the second sacrificial spacer structure 21R, and the second dielectric spacer 12R is embedded in the first dielectric material layer 18.

Figure 4A:
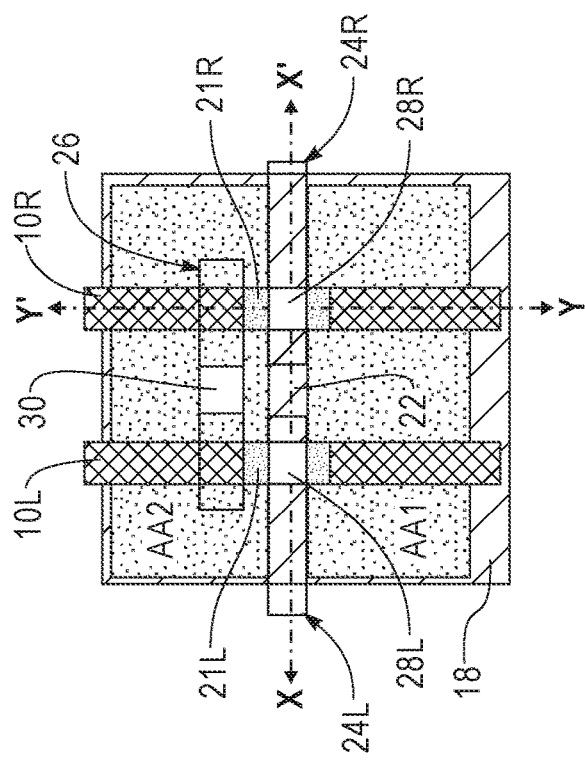
FIG. 4A is a top down view of the exemplary semiconductor structure of FIG. 3A after forming a source/drain contact via in a portion of the third metallization trench.
Figure 4C:
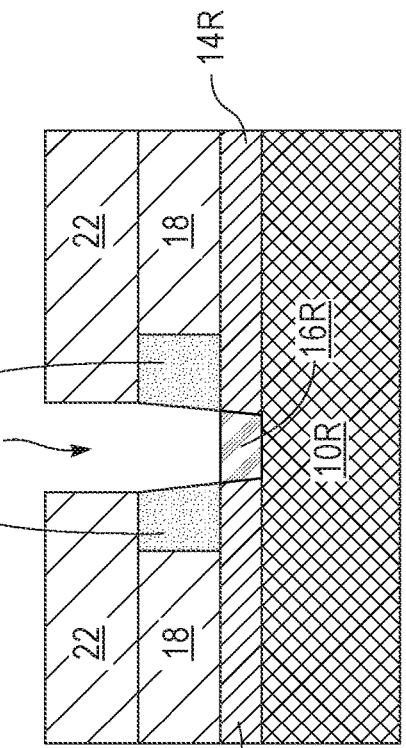
FIG. 4C is a cross view of the exemplary semiconductor structure of FIG. 4A through line Y-Y'.
Figure 4B:
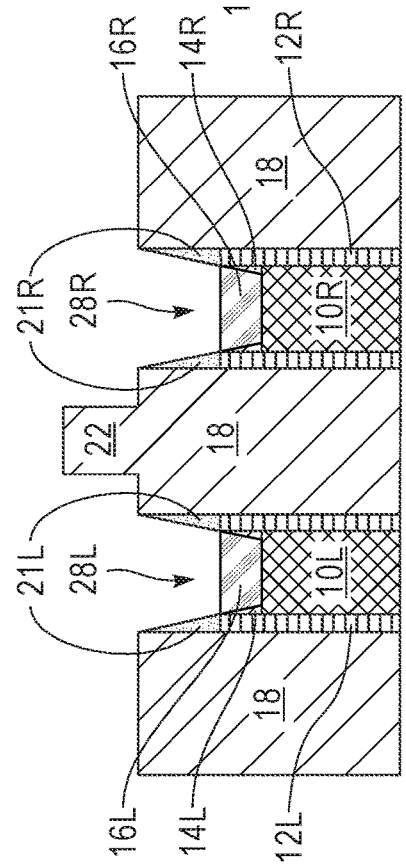
FIG. 4B is a cross view of the exemplary semiconductor structure of FIG. 4A through line X-X'.

Referring now to FIGS. 4A, 4B and 4C, there are shown various views of the exemplary semiconductor structure of FIGS. 3A, 3B and 3C after forming a source/drain contact via 30 in a portion of the third metallization trench 26. The source/drain contact via 30 can be formed utilizing an etch that is selective in removing the dielectric material i.e., silicon dioxide. The source/drain contact via 30 physically exposes a surface of a source/drain region.

Figure 5A:
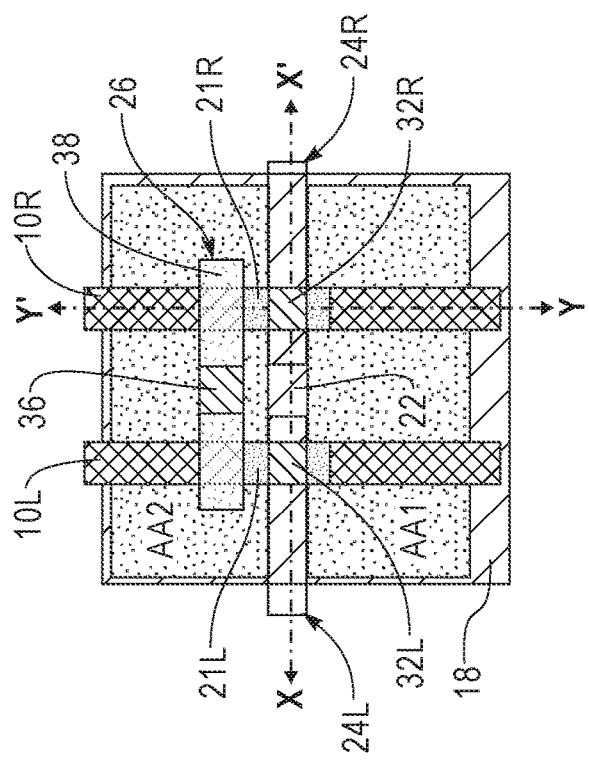
FIG. 5A is a top down view of the exemplary semiconductor structure of FIG. 4A after filling each of the first gate contact via, the first metallization trench, the second gate contact via, the second metallization trench, the source/drain contact via and the third metallization trench with a contact metal or contact metal alloy.
Figure 5C:
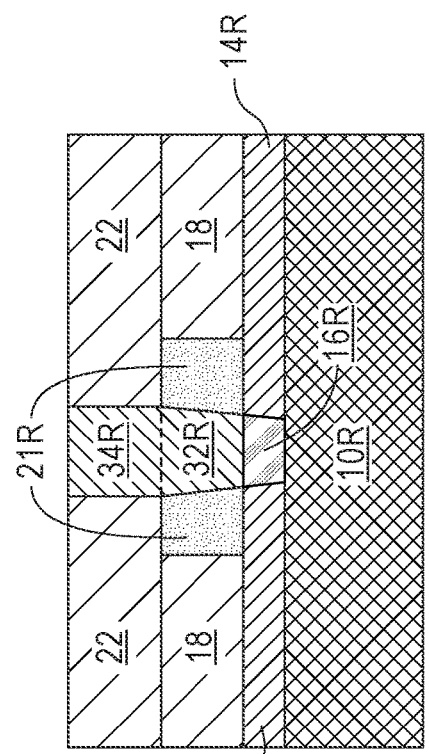
FIG. 5C is a cross view of the exemplary semiconductor structure of FIG. 5A through line Y-Y'.
Figure 5B:
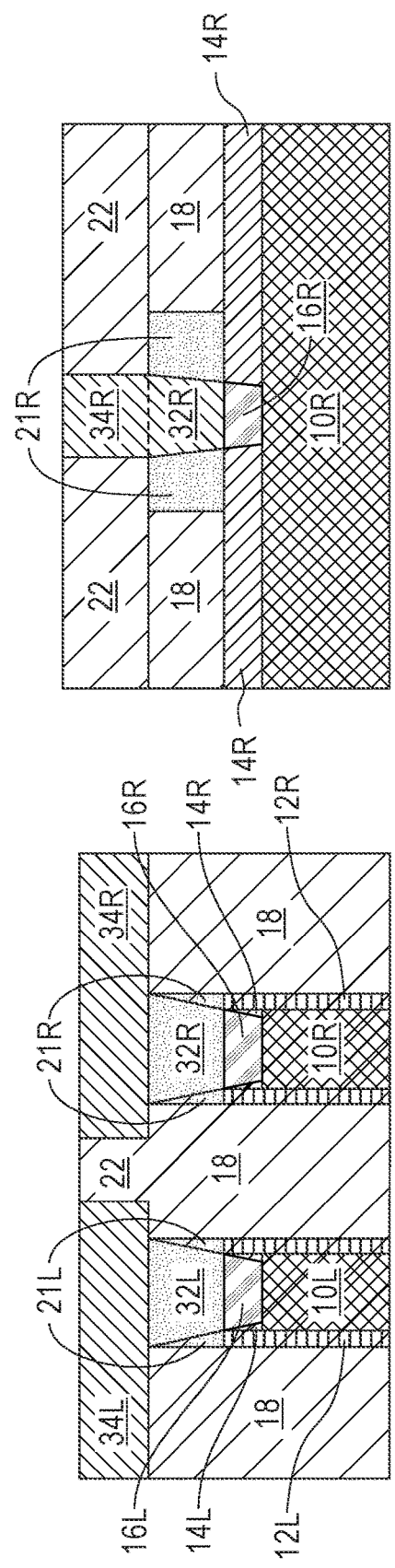
FIG. 5B is a cross view of the exemplary semiconductor structure of FIG. 5A through line X-X'.

Referring now to FIGS. 5A, 5B and 5C, there are shown various views of the exemplary semiconductor structure of FIGS. 4A, 4B and 4C after filling each of the first gate contact via 28L, the first metallization trench 24L, the second gate contact via 28R, the second metallization trench 24R, the source/drain contact via 30 and the third metallization trench 26 with a contact metal or contact metal alloy. In the top down view of FIG. 5A, the contact metal or metal alloy that is formed into the first and second metallization trenches is not shown to emphasize the underlying gate contact structures that are formed.

Examples of contact metals include, but are not limited to, tungsten (W), aluminum (Al), copper (Cu), or cobalt (Co). An example of a contact metal alloy is Cu—Al alloy. The filling of each of the first gate contact via 28L, the first metallization trench 24L, the second gate contact via 28R, the second metallization trench 24R, the source/drain contact via 30 and the third metallization trench 26 may include any conventional deposition process including, for example, chemical vapor deposition, plasma enhanced chemical vapor deposition, sputtering or plating. A planarization process may follow the filling of each of the first gate contact via 28L, the first metallization trench 24L, the second gate contact via 28R, the second metallization trench 24R, the source/drain contact via 30 and the third metallization trench 26.

The contact metal or contact metal alloy that is present in the first gate contact via 28L provides a first gate contact structure 32L, and the contact metal or contact metal alloy that is present in the first metallization trench 24L provides a first metallization structure 34L. The first gate contact structure 32L and the first metallization structure 34L are of unitary construction and are composed of a same contact metal or metal alloy; the dotted line is shown to emphasize the located of the first gate contact structure 32L relative to the first metallization structure 34L. The first gate contact structure 32L is located on a topmost surface of the first metal-containing structure 16L.

The contact metal or contact metal alloy that is present in the second gate contact via 28R provides a second gate contact structure 32R, and the contact metal or contact metal alloy that is present in the second metallization trench 24R provides a second metallization structure 34R. The second gate contact structure 32R and the second metallization structure 34R are of unitary construction and are composed of a same contact metal or metal alloy; the dotted line is shown to emphasize the located of the second gate contact structure 32R relative to the second metallization structure 34R. The second gate contact structure 32R is located on a topmost surface of the second metal-containing structure 16R.

The contact metal or contact metal alloy that is present in the source/drain contact via 30 provides a source/drain contact structure 36, and the contact metal or contact metal alloy that is present in the third metallization trench 26 provides a third metallization structure 38. The source/drain contact structure 36 and the third metallization structure 38 are of unitary construction and are composed of a same contact metal or metal alloy; the source/drain contact structure 36 contacts a surface of a source/drain region. The third metallization structure 38 can be referred to as a source/drain metallization structure.

The first metallization structure 34L, the second metallization structure 34R and the third metallization structure 38 are spaced apart from each other and are present in a same level. Each of the first metallization structure 34L, the second metallization structure 34R and the third metallization structure 38 is embedded in the second dielectric material layer 18. The first metallization structure 34L is isolated from the second metallization structure 34 by a portion of the second dielectric material layer 22.

In accordance with the present application, the first gate contact structure 32L and the second gate contact structure 32R are 2D self-aligned contacts. Notably, the first gate contact structure 32L and the second gate contact structure 32R are self-aligned in one direction (i.e., the x-direction) by the material difference provided by the first sacrificial spacer structure 21L and the second sacrificial spacer structure 21R, respectively (See, for example, FIG. 5B). Further, the first gate contact structure 32L and the second gate contact structure 32R are self-aligned in another direction (i.e., the y-direction) by the edge of the first metallization structure 34L (or the first metallization trench) and the second metallization structure 34R (or the second metallization trench), respectively (See, for example, FIG. 5C).

The source/drain contact structure 36 is also a 2D self-aligned contact. Notably, the source/drain contact structure 36 is self-aligned in one direction (i.e., the x-direction) by the material difference provided by the dielectric material layer 18 that is between neighboring gate structures, the gate cap dielectric material 14L, 14R that is located on the gate structures, and the spacers 12L, 12R, and in another direction (i.e., the y-direction) by the edge of the trench 26.

Figure 6A:
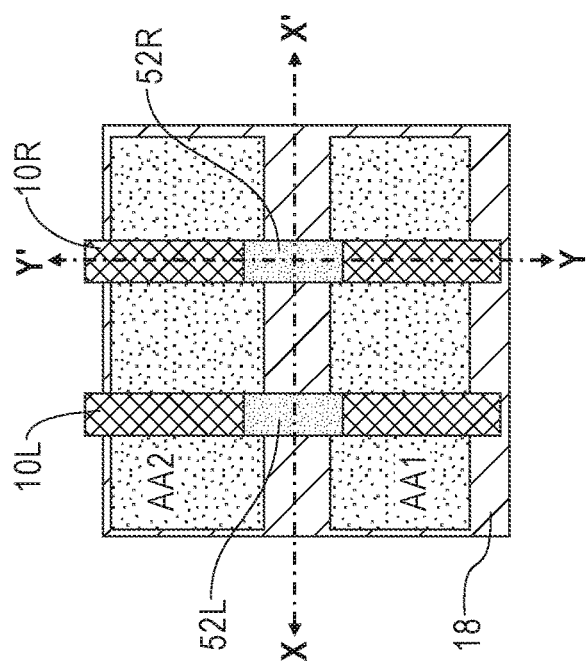
FIG. 6A is a top down view of an exemplary semiconductor structure that can be employed in accordance with another embodiment of the present application, the exemplary structure includes a first gate structure comprising a first gate electrode and a first gate cap dielectric material, a second gate structure comprising a second gate conductor and a second gate cap dielectric material, and a first dielectric material layer laterally surrounding the first and second gate structures, wherein a first sacrificial structure is embedded in the first dielectric material layer and contacting the first gate cap dielectric material, and a second sacrificial structure is embedded in the first dielectric material layer and contacting the second gate cap dielectric material.
Figure 6C:
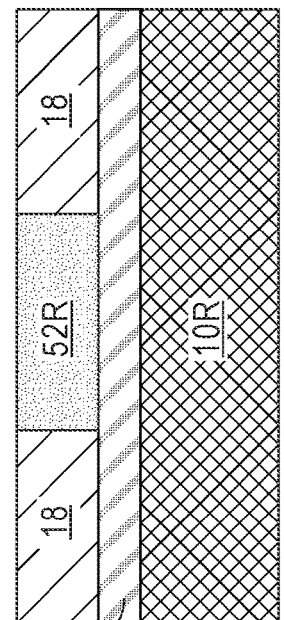
FIG. 6C is a cross view of the exemplary semiconductor structure of FIG. 6A through line Y-Y'.
Figure 6B:
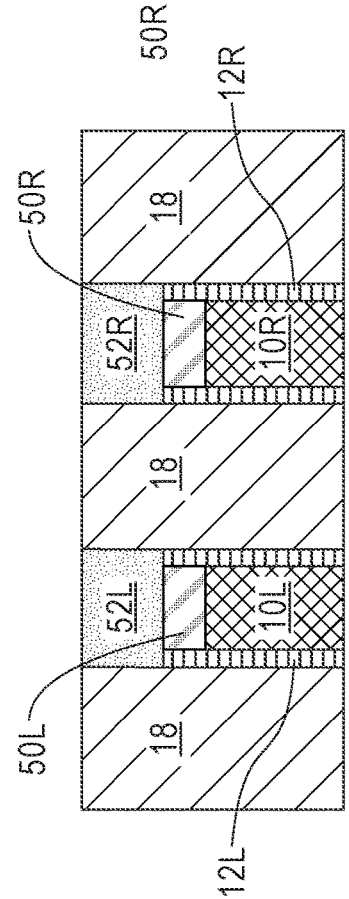
FIG. 6B is a cross view of the exemplary semiconductor structure of FIG. 6A through line X-X'.

Referring now to FIGS. 6A, 6B and 6C, there are shown various views of an exemplary semiconductor structure that can be employed in accordance with another embodiment of the present application. The exemplary structure of this embodiment includes a first gate structure comprising a first gate electrode 10L (as defined above) and a first gate cap dielectric material 50L, a second gate structure comprising a second gate conductor 10R (as defined above) and a first gate cap dielectric material 50R, and a first dielectric material layer 18 (as defined above) laterally surrounding the first and second gate structures, wherein a first sacrificial structure 52L is embedded in the first dielectric material layer 18 and contacting the first gate cap dielectric material 50L, and a second sacrificial structure 52R is embedded in the first dielectric material layer 18 and contacting the second gate cap dielectric material 50R.

The first gate structure may also include a first dielectric spacer 12L (as defined above) located laterally adjacent to the first gate conductor 10L and the first gate cap dielectric material 50L. The second gate structure may also include a second dielectric spacer 12R located laterally adjacent to the second gate conductor 10R and the second gate cap dielectric material 50R.

The exemplary structure shown in FIGS. 6A, 6B and 6C can be formed utilizing techniques well known to those skilled in the art. So as not to obscure the method of the present application, details regarding the method used in providing the exemplary structure shown in FIGS. 6A, 6B and 6C have been omitted.

Although not shown in the drawings, the first gate structure would include a first gate dielectric material located beneath and optionally along sidewalls, of the first gate electrode 10L, and the second gate structure would include a second gate dielectric material located beneath and optionally along sidewalls, of the second gate electrode 10R. The first and second gate dielectric materials are as defined above.

In the top down view shown in FIG. 6A, element AA1 represent a first active area and element AA2 represents a second active area. The first and second active areas AA1 and AA2 are regions of the structure including a semiconductor material, as defined above. In some embodiments, the semiconductor material that provides the first and second active areas AA1 and AA2 is present on a base semiconductor material, as defined above. In some embodiments, the semiconductor material that provides the first and second active areas AA1 and AA2 is present on an insulator layer such as, for example, a silicon dioxide layer. In one embodiment, the semiconductor material that provides the first and second active areas is a semiconductor fin, as defined above.

The first gate cap dielectric material 50L and the second gate cap dielectric material 50R may be composed of any gate cap dielectric material. Illustrative examples of gate cap dielectric materials that can be used in providing the first and second gate cap dielectric materials 50L and 50R include silicon dioxide and/or silicon nitride. The first gate cap dielectric material 50L may be composed of a compositionally same gate gap material as, or a compositionally different gate cap dielectric material than, the second gate cap dielectric material 50R. The gate cap dielectric material that provides the first and second gate cap dielectric materials 50L and 50R can be formed by any suitable deposition process such as, for example, chemical vapor deposition or plasma enhanced chemical vapor deposition. In one embodiment, the gate cap dielectric material that provides the first and second gate cap dielectric materials 50L and 50R can have a thickness from 10 nm to 100 nm. Other thicknesses that are lesser than, or greater than, the aforementioned thickness range can also be employed for the gate cap dielectric material used in providing the first and second gate cap dielectric materials 50L and 50R.

The first and second sacrificial structures 52L and 52R are formed by forming a first opening (not shown) and a second opening (not shown) into the first dielectric material layer 18 utilizing lithography and etching. The first opening is located above the first gate cap dielectric material 50L of the first gate structure, and the second opening is located above the second gate gap dielectric material 50R of the second gate structure. A first sacrificial structure 52L is formed in the first opening, and a second sacrificial structure 52R is formed in the second opening. The first and second sacrificial structures 52L and 52R are formed by first depositing a sacrificial dielectric material in each of the first and second openings and atop the first dielectric material layer 18, and then a planarization process such as, for example, chemical mechanical polishing can be used to remove the sacrificial dielectric material that is present outside the first and second openings and atop the first dielectric material layer 18.

The first and second sacrificial structures 52L and 52R are composed of a compositionally same sacrificial dielectric material. The sacrificial dielectric material that provides the first and second sacrificial structures 52L and 52R is compositionally different from the dielectric material that provides the first dielectric material layer 18 (and the second dielectric material layer to be subsequently formed), the first and second spacers 12L and 12R and the first and second gate cap dielectric materials 50L and 50R. In one example, the sacrificial dielectric material that provides the first and second sacrificial structures 52L and 52R is composed of a dielectric material having a dielectric constant that is lower than silicon dioxide. Examples of dielectric materials having a dielectric constant that is lower silicon dioxide and thus can be used as the sacrificial dielectric material that provides the first and second sacrificial structures 52L and 52R include, but are not limited to, SiC, SiOC or SiBCN. As is shown, each of the first and second sacrificial structures 52L and 52R has a topmost surface that is coplanar with each other, and coplanar with the topmost surface of the first dielectric material layer 18.

Figure 7A:
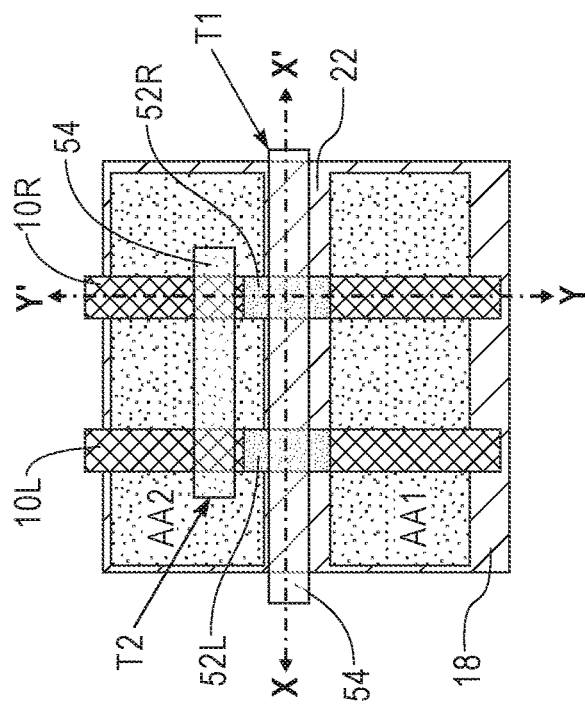
FIG. 7A is a top down view of the exemplary structure of FIG. 6A after forming a second dielectric material layer containing a first trench located above the first and second gate structures, and a second trench located above the source/drain region, and then filling the first and second trenches with a sacrificial trench material that is compositionally different from the first and second sacrificial structures.
Figure 7C:
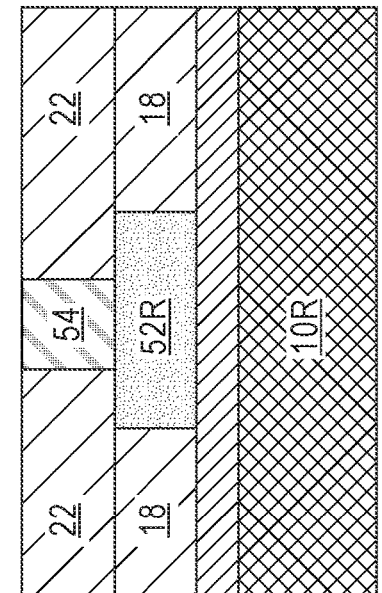
FIG. 7C is a cross view of the exemplary semiconductor structure of FIG. 7A through line Y-Y'.
Figure 7B:
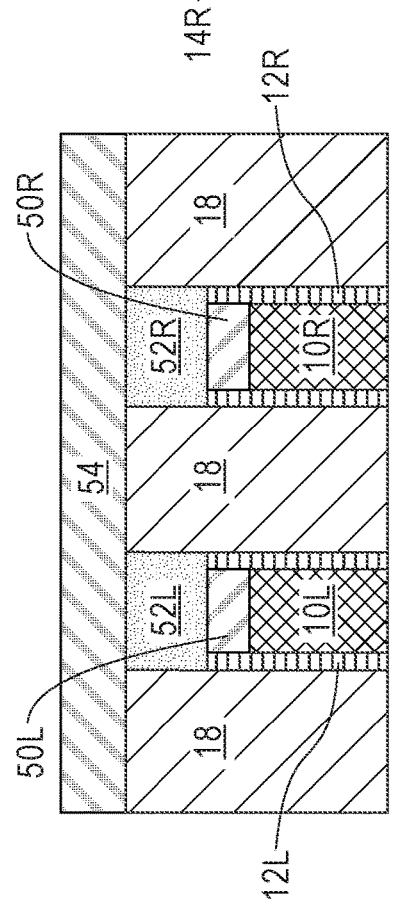
FIG. 7B is a cross view of the exemplary semiconductor structure of FIG. 7A through line X-X'.

Referring now to FIGS. 7A, 7B and 7C, there are shown various views of the exemplary structure of FIGS. 6A, 6B and 6C after forming a second dielectric material layer 22 containing a first trench, T1, located above the first and second gate structures, and a second trench, T2, located above the source/drain region, and then filling the first and second trenches T1 and T2 with a sacrificial trench material that is compositionally different from the first and second sacrificial structures 52L and 52R.

The second dielectric material layer 22 is the same as defined above in the previous embodiment of the present application. The first and second trenches Ti and T2 can be formed by lithography and etching. In some embodiments, the sacrificial trench material 54 can be composed of an organic planarization material or amorphous silicon. The sacrificial trench material 54 can be formed utilizing a deposition process such as, for example, chemical vapor deposition, plasma enhanced chemical vapor deposition or spin-coating. A planarization process such as, for example, chemical mechanical polishing can follow the deposition process. The sacrificial trench material 54 can have a thickness from 50 nm to 200 nm; although other thicknesses are possible and can be used as the thickness of the sacrificial trench material 54. The sacrificial trench material 54 has a topmost surface that is coplanar with a topmost surface of the second dielectric material layer 22.

Figure 8A:
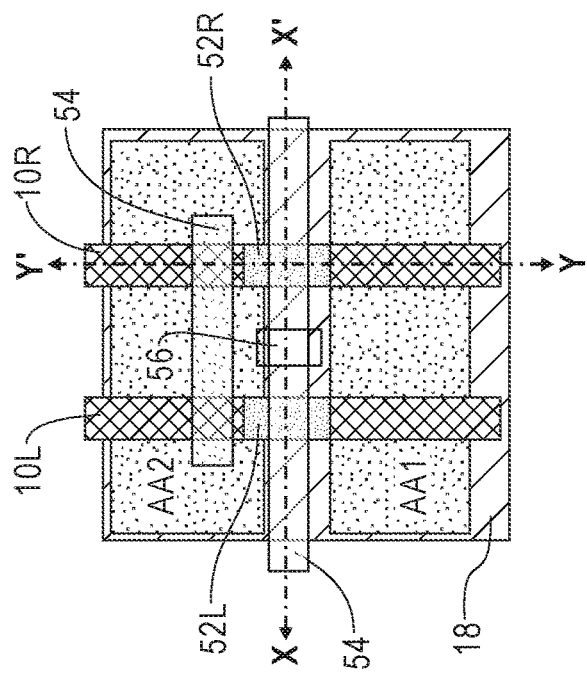
FIG. 8A is a top down view of the exemplary structure of FIG. 7A after cutting the sacrificial trench material that is present in the first trench to provide a gap between the first and second gate structures.
Figure 8C:
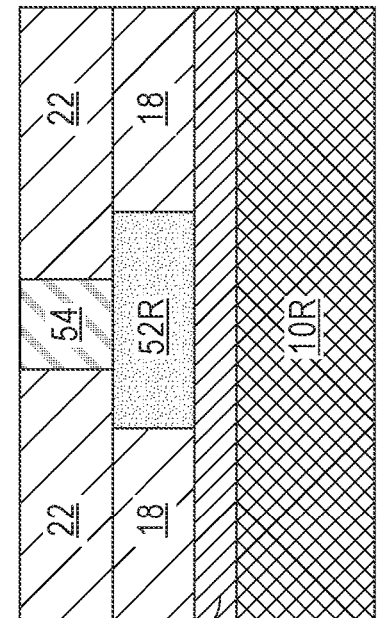
FIG. 8C is a cross view of the exemplary semiconductor structure of FIG. 8A through line Y-Y'.
Figure 8B:
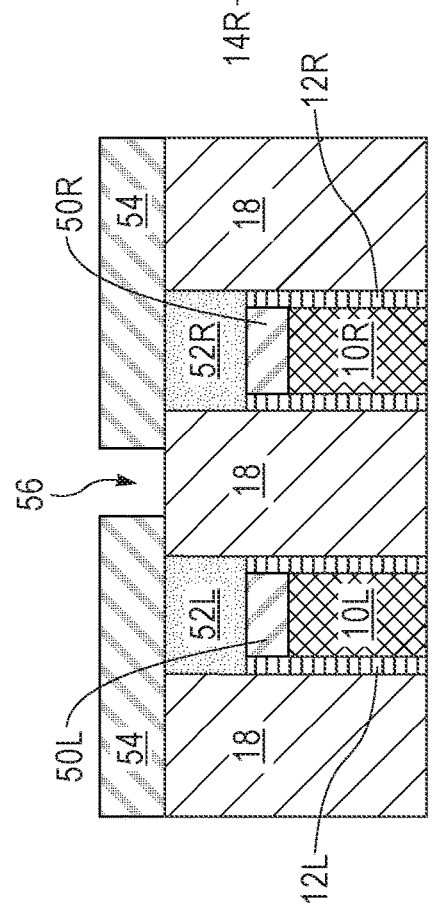
FIG. 8B is a cross view of the exemplary semiconductor structure of FIG. 8A through line X-X'.

Referring now to FIGS. 8A, 8B and 8C, there are shown various views of the exemplary structure of FIGS. 7A, 7B and 7C after cutting the sacrificial trench material 54 that is present in the first trench T1 to provide a gap 56 between the first and second gate structures. The cutting of the sacrificial trench material 54 in the first trench T1 may include lithography and etching.

Figure 9A:
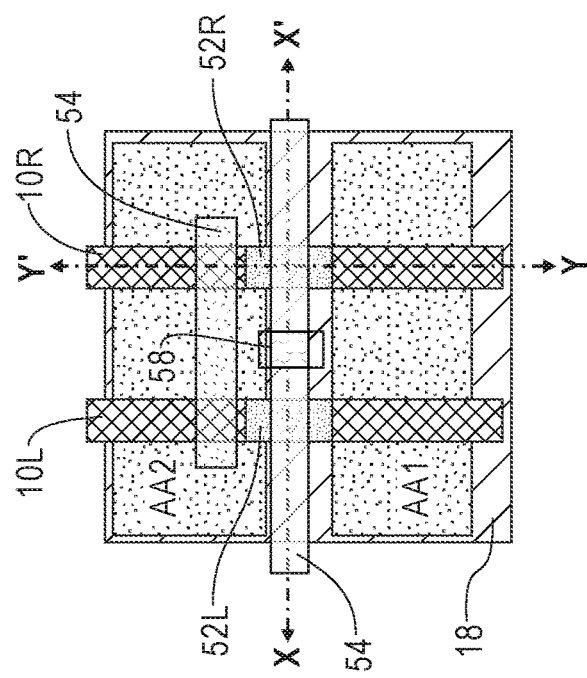
FIG. 9A is a top down view of the exemplary structure of FIG. 8A after filling the gap in the cut sacrificial trench material with a gap filling material.
Figure 9C:
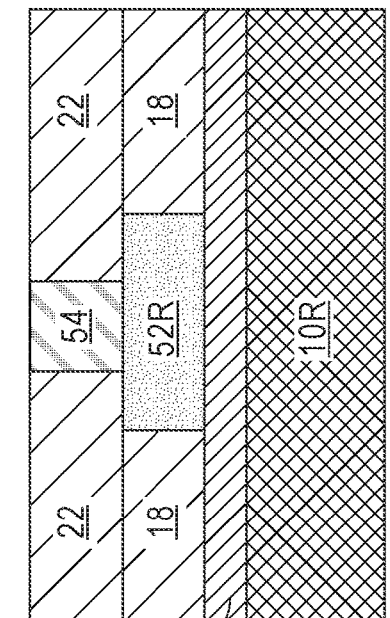
FIG. 9C is a cross view of the exemplary semiconductor structure of FIG. 9A through line Y-Y'.
Figure 9B:
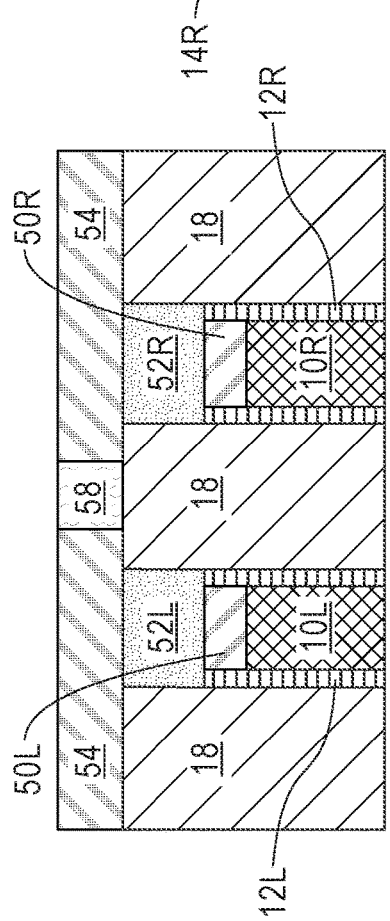
FIG. 9B is a cross view of the exemplary semiconductor structure of FIG. 9A through line X-X'.

Referring now to FIGS. 9A, 9B and 9C, there are shown the exemplary structure of FIGS. 8A, 8B and 8C after filling the gap 56 in the cut sacrificial trench material 54 with a gap filling material 58. The gap filling material 58 can include a dielectric metal oxide such as, for example, aluminum oxide or hafnium dioxide. The filling of the gap 56 may include a deposition process such as for example, chemical vapor deposition or plasma enhanced chemical vapor deposition. A planarization process such as, for example, chemical mechanical polishing can follow the deposition process. The gap filling material 58 has a topmost surface that is coplanar with a topmost surface of the sacrificial trench material 54. The gap filling material will serves as a mask which can isolate the first gate structure from the second gate structure.

Figure 10A:
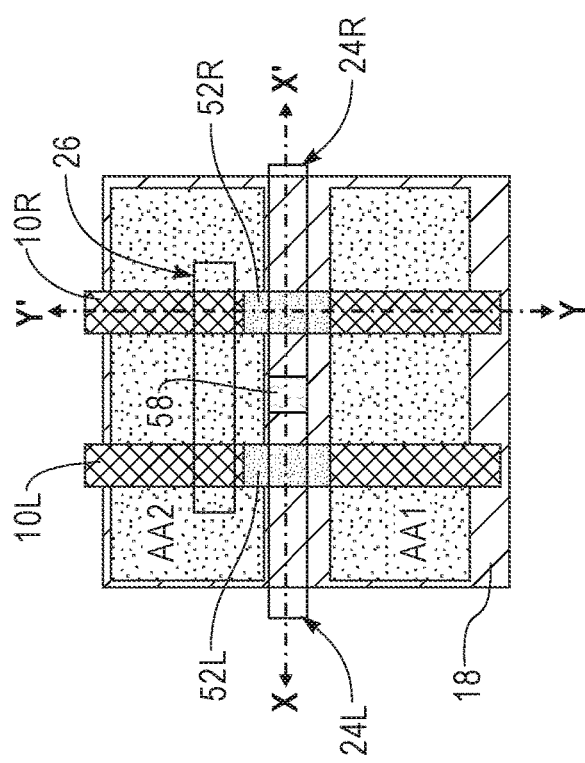
FIG. 10A is a top down view of the exemplary structure of FIG. 9A after removing the remaining sacrificial trench material, wherein after the removal of the remaining sacrificial trench material a first metallization trench, a second metallization trench and a third metallization trench are formed, wherein the first metallization trench is located over the first gate structure, the second metallization trench is located over the second gate structure, and the third metallization trench is located over the source/drain region.
Figure 10C:
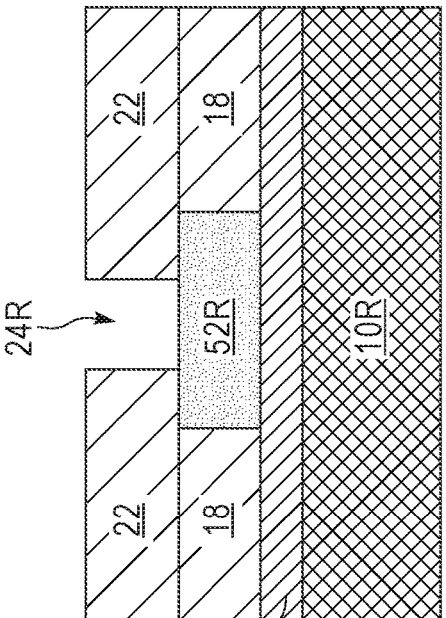
FIG. 10C is a cross view of the exemplary semiconductor structure of FIG. 10A through line Y-Y'.
Figure 10B:
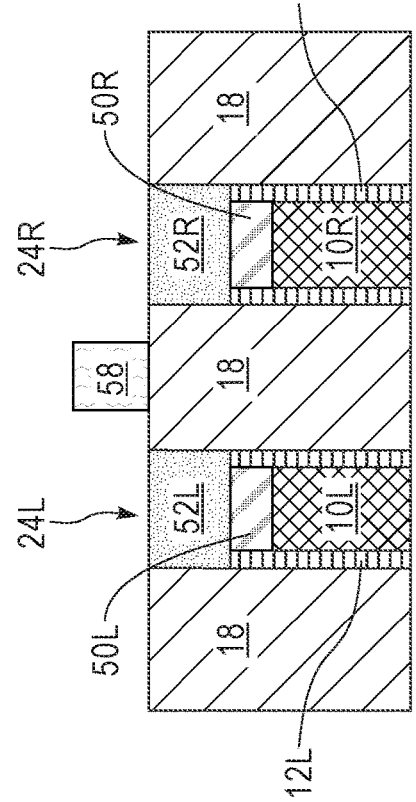
FIG. 10B is a cross view of the exemplary semiconductor structure of FIG. 10A through line X-X'.

Referring now to FIGS. 10A, 10B and 10C, there are shown various views of the exemplary structure of FIGS. 9A, 9B and 9C after removing the remaining sacrificial trench material 54 (in both the first and second trenches T1 and T2), wherein after the removal of the remaining sacrificial trench material 54, a first metallization trench 24L, a second metallization trench 24R and a third metallization trench 26 are formed, wherein the first metallization trench 24L is located over the first gate structure, the second metallization trench 24R is located over the second gate structure, and the third metallization trench 26 is located over the source/drain region.

The removal of the remaining sacrificial trench material 54 in the first and second trenches T1 and T2 can be performed utilizing an etching process that is selective in removing the sacrificial trench material 54 from the structure. In one embodiment, and when amorphous silicon is used as the sacrificial trench material 54, $CF_4$, $SF_6$, $NF_3$ or $Cl_2$ can be used as an etchant to selectively remove the remaining sacrificial material 54.

Each of the first metallization trench 24L, the second metallization trench 24R and the third metallization trench 26 may have a width from 10 nm to 100 nm, and a length from 10 nm to 10 μm. Other widths and lengths are possible for each of the first metallization trench 24L, the second metallization trench 24R and the third metallization trench 26.

The first metallization trench 24L, which is located above the first gate structure, physically exposes the first sacrificial structure 52L that is embedded in the first dielectric material layer 18, the second metallization trench 24R, which is located above the second gate structure, physically exposes the second sacrificial structure 52R that is embedded in the first dielectric material layer 18, and the third metallization trench 26, which is located above the source/drain region physically exposes the dielectric material layer 18 that is between neighboring gate structures, the gate cap dielectric material and the spacers that is located on the gate structures.

Referring now to FIGS. 11A, 11B and 11C, there are illustrated various views of the exemplary structure of FIGS. 10A, 10B and 10C after removing the first sacrificial structure 52L and the first gate cap dielectric material 50L from the first metallization trench 24L to define a first gate contact via 28L, and removing the second sacrificial structure 52R and the second gate cap dielectric material 50R from the second metallization trench 24R to define a second gate contact via 28R.

The removal of the first and second sacrificial structures 52L and 52R that are physically exposed in the respective metallization trench is performed simultaneously utilizing a same etching process. The etching process is selective in removing the physically exposed portions of the first and second sacrificial structures 52L and 52R. Another etch can then performed to remove the first and second gate cap dielectric materials 50L and 50R from the respective metallization trench. In some embodiments, a single etch can be used to form the first and second gate contact vias 28L and 28R.

As is shown, portions of the first sacrificial structure 52L remain and define the sidewalls of the first gate contact via 28L; the remaining portions of the first sacrificial structure 52L may be referred to herein as a first sacrificial spacer structure 53L. As is also shown, portions of the second sacrificial structure 52R remain and define the sidewalls of the second gate contact via 28R; the remaining portions of the second sacrificial structure 52R may be referred to herein as a second sacrificial spacer structure 53R. The first and second sacrificial spacer structures 53L and 53R have innermost sidewalls that may be vertical or have some slight tapering as shown in FIGS. 11B and 11C.

The first gate contact via 28L, which is located above the first gate structure, physically exposes the first gate conductor 10L, while the second gate contact via 28R, which is located above the second gate structure, physically exposes the second gate conductor 10R.

As is shown, the first sacrificial spacer structure 53L is located on a surface of the first dielectric spacer 12L that is located adjacent to the first gate structure, and the second sacrificial spacer structure 53R is located on a surface of the second dielectric spacer 12R that is located adjacent to the second gate structure. Each of the first sacrificial spacer structure 53L, the first dielectric spacer 12L, the second sacrificial spacer structure 53R, and the second dielectric spacer 12R is embedded in the first dielectric material layer 18.

Referring now to FIGS. 12A, 12B and 12C, there are shown through various views the exemplary semiconductor structure of FIGS. 11A, 11B and 11C after forming a source/drain contact via 30 the third metallization trench 26. The source/drain contact via 30 can be formed utilizing an etch that is selective in removing the dielectric material that is located between the gate structures. The source/drain contact via 30 physically exposes a surface of a source/drain region.

Referring now to FIGS. 13A, 13B and 13C, there are shown through various views the exemplary semiconductor structure of FIGS. 12A, 12B and 12C after filling each of the first gate contact via 28L, the first metallization trench 24L, the second gate contact via 28R, the second metallization trench 24R, the source/drain contact via 30 and the third metallization trench 26 with a contact metal or contact metal alloy. In the top down view of FIG. 13A, the contact metal or metal alloy that is formed into the first and second metallization trenches is not shown to emphasize the underlying gate contact structures that are formed.

Examples of contact metals include, but are not limited to, tungsten (W), aluminum (Al), copper (Cu), or cobalt (Co). An example of a contact metal alloy is Cu—Al alloy. The filling of each of the first gate contact via 28L, the first metallization trench 24L, the second gate contact via 28R, the second metallization trench 24R, the source/drain contact via 30 and the third metallization trench 26 may include any conventional deposition process including, for example, chemical vapor deposition, plasma enhanced chemical vapor deposition, sputtering or plating. A planarization process may follow the filling of each of the first gate contact via 28L, the first metallization trench 24L, the second gate contact via 28R, the second metallization trench 24R, the source/drain contact via 30 and the third metallization trench 26.

The contact metal or contact metal alloy that is present in the first gate contact via 28L provides a first gate contact structure 32L, and the contact metal or contact metal alloy that is present in the first metallization trench 24L provides a first metallization structure 34L. The first gate contact structure 32L and the first metallization structure 34L are of unitary construction and are composed of a same contact metal or metal alloy; the dotted line is shown to emphasize the located of the first gate contact structure 32L relative to the first metallization structure 34L. The first gate contact structure 32L is located directly on a topmost surface of the first gate electrode 10L.

The contact metal or contact metal alloy that is present in the second gate contact via 28R provides a second gate contact structure 32R, and the contact metal or contact metal alloy that is present in the second metallization trench 24R provides a second metallization structure 34R. The second gate contact structure 32R and the second metallization structure 34R are of unitary construction and are composed of a same contact metal or metal alloy; the dotted line is shown to emphasize the located of the second gate contact structure 32R relative to the second metallization structure 34R. The second gate contact structure 32R is located directly on a topmost surface of the second gate electrode 10R.

The contact metal or contact metal alloy that is present in the source/drain contact via 30 provides a source/drain contact structure 36, and the contact metal or contact metal alloy that is present in the third metallization trench 26 provides a third metallization structure 38. The source/drain contact structure 36 and the third metallization structure 38 are of unitary construction and are composed of a same contact metal or metal alloy; the source/drain contact structure 36 contacts a surface of a source/drain region. The third metallization structure 38 can be referred to as a source/drain metallization structure.

The first metallization structure 34L, the second metallization structure 34R and the third metallization structure 38 are spaced apart from each other and are present in a same level. The first metallization structure 34L is isolated from the second metallization structure 34 by a portion of the gap filling material 58.

In accordance with the present application, the first gate contact structure 32L and the second gate contact structure 32R are 2D self-aligned contacts. Notably, the first gate contact structure 32L and the second gate contact structure 32R are self-aligned in one direction (i.e., the x-direction) by the material difference provided by the first sacrificial spacer structure 53L and the second sacrificial spacer structure 53R, respectively (See, for example, FIG. 13B). Further, the first gate contact structure 32L and the second gate contact structure 32R are self-aligned in another direction (i.e., the y-direction) by the edge of the first metallization structure 34L (of the first metallization trench) and the second metallization structure 34R (or the second metallization trench), respectively (See, for example, FIG. 13C).

The source/drain contact structure 36 is also a 2D self-aligned contact. Notably, the source/drain contact structure 36 is self-aligned in one direction (i.e., the x-direction) by the material difference provided by the dielectric material layer 18 that is between neighboring gate structures, the gate cap dielectric material 14L, 14R that is located on the gate structures, and the spacers 12L, 12R, and in another direction (i.e., the y-direction) by the edge of the trench 26.

While the present application has been particularly shown and described with respect to preferred embodiments thereof, it will be understood by those skilled in the art that the foregoing and other changes in forms and details may be made without departing from the spirit and scope of the present application. For example, and although the various embodiments of the present application illustrate the presence of a first gate structure and a second gate structure, the present application can be employed when a single gate structure or more than two gate structures are employed. It is therefore intended that the present application not be limited to the exact forms and details described and illustrated, but fall within the scope of the appended claims.

What is claimed is:

1. A semiconductor structure comprising:
    a gate structure present on a semiconductor material and comprising at least a gate electrode, wherein a source/drain region is present in the semiconductor material;
    a dielectric material layer laterally adjacent to the gate structure and present on the semiconductor material;
    a gate contact structure located above the gate electrode;
    a metallization structure located on the gate contact structure, wherein the gate contact structure is confined in one direction by a sacrificial spacer structure that is present in the dielectric material layer, and in another direction by an edge of the metallization structure; and
    a source/drain contact structure located above the source/drain region and a source/drain metallization located on the source/drain contact structure, wherein the source/drain contact structure is confined in one direction by a dielectric material layer that is adjacent to the gate structure, a gate cap dielectric material that is located on the gate structure, and a dielectric spacer that is located on a sidewall of the gate structure, and in another direction by the edge of a source/drain metallization trench, wherein the metallization structure and the gate contact structure are of unitary construction and comprise a same contact metal or metal alloy, and the source/drain metallization structure and the source/drain contact structure are of unitary construction and comprise a same contact metal or metal alloy.

2. The semiconductor structure of claim 1, further comprising another dielectric material layer located above the dielectric material layer that is located laterally adjacent to the gate structure, and wherein the metallization structure and the source/drain metallization structure are embedded in the another dielectric material layer.

3. The semiconductor structure of claim 2, wherein the gate contact structure directly contacts a surface of a metal-containing structure that is present on the gate electrode.

4. The semiconductor structure of claim 1, wherein the semiconductor material is a semiconductor fin.

5. The semiconductor structure of claim 1, further comprising:
    another gate structure present on the semiconductor material and comprising at least another gate electrode, wherein the another gate structure is present in the dielectric material layer and is laterally adjacent to the gate structure;
    another gate contact structure located above the another gate electrode; and
    another metallization structure located on the another gate contact structure, wherein the another gate contact structure is confined in one direction by another sacrificial spacer structure that is present in the dielectric material layer, and in another direction by an edge of the another metallization structure.

6. A semiconductor structure comprising:
    a gate structure present on a semiconductor material and comprising at least a gate electrode, wherein a source/drain region is present in the semiconductor material;
    a dielectric material layer laterally adjacent to the gate structure and present on the semiconductor material;
    a gate contact structure located above the gate electrode;
    a metallization structure located on the gate contact structure, wherein the gate contact structure is confined in one direction by a sacrificial spacer structure that is present in the dielectric material layer, and in another direction by an edge of the metallization structure, the metallization structure is present in a metallization trench that is defined by a gap filling material that is present on a surface of the dielectric material layer, and the gate contact structure directly contacts a surface of the gate electrode.

7. The semiconductor structure of claim 6, further comprising a source/drain contact structure located above the source/drain region and a source/drain metallization located on the source/drain contact structure, wherein the source/drain contact structure is confined in one direction by a dielectric material layer that is adjacent to the gate structure, a gate cap dielectric material that is located on the gate structure, and a spacer that is located on a sidewall of the gate structure, and in another direction by the edge of a source/drain metallization trench.

8. The semiconductor structure of claim 7, wherein the metallization structure and the gate contact structure are of unitary construction and comprise a same contact metal or metal alloy, and the source/drain metallization structure and the source/drain contact structure are of unitary construction and comprise a same contact metal or metal alloy.

9. The semiconductor structure of claim 6, wherein the sacrificial spacer structure is located on a surface of a dielectric spacer that is located adjacent to the gate structure.

10. A semiconductor structure comprising:
a gate structure present on a semiconductor material and comprising at least a gate electrode, wherein a source/drain region is present in the semiconductor material;
a dielectric material layer laterally adjacent to the gate structure and present on the semiconductor material;
a gate contact structure located above the gate electrode;
a metallization structure located on the gate contact structure, wherein the gate contact structure is confined in one direction by a sacrificial spacer structure that is present in the dielectric material layer, and in another direction by an edge of the metallization structure;
another gate structure present on the semiconductor material and comprising at least another gate electrode, wherein the another gate structure is present in the dielectric material layer and is laterally adjacent to the gate structure;
another gate contact structure located above the another gate electrode; and
another metallization structure located on the another gate contact structure, wherein the another gate contact structure is confined in one direction by another sacrificial spacer structure that is present in the dielectric material layer, and in another direction by an edge of the another metallization structure.

11. The semiconductor structure of claim 10, wherein the metallization structure is present in a metallization trench that is defined by a gap filling material that is present on a surface of the dielectric material layer.

12. The semiconductor structure of claim 11, wherein the gate contact structure directly contacts a surface of the gate electrode.

* * * * *